(12) United States Patent
Qiu et al.

(10) Patent No.: US 8,257,128 B2
(45) Date of Patent: Sep. 4, 2012

(54) METHODS OF PREPARING A LI FILM AND METHODS OF PREPARING AN ORGANIC LIGHT EMITTING DEVICE

(75) Inventors: Yong Qiu, Beijing (CN); Deqiang Zhang, Beijing (CN); Yang Li, Beijing (CN); Guohui Zhang, Beijing (CN); Kongwu Wu, Beijing (CN); Lian Duan, Beijing (CN); Yudi Gao, Beijing (CN)

(73) Assignees: Tsinghua University, Beijing (CN); Beijing Visionox Technology, Beijing (CN); Kunshan Visionox Display Co., Ltd., Jiangsu (CN)

( * ) Notice: Subject to any disclaimer, the term of this patent is extended or adjusted under 35 U.S.C. 154(b) by 728 days.

(21) Appl. No.: 12/192,668

(22) Filed: Aug. 15, 2008

(65) Prior Publication Data

US 2009/0045737 A1 Feb. 19, 2009

(30) Foreign Application Priority Data

Aug. 16, 2007 (CN) .......................... 2007 1 0120335

(51) Int. Cl.
*H01J 9/00* (2006.01)

(52) U.S. Cl. ......................................................... 445/23
(58) Field of Classification Search .............. 445/23–25; 313/504, 506; 428/690, 917
See application file for complete search history.

(56) References Cited

U.S. PATENT DOCUMENTS 6,534,202 B2 * 3/2003 Sato et al. ..................... 428/690

* cited by examiner

*Primary Examiner* — Joseph L Williams
(74) *Attorney, Agent, or Firm* — Foley & Lardner LLP

(57) ABSTRACT

The present invention relates to a method of preparing a Li film, wherein said Li film is fabricated by directly decomposing a compound of Li under a vacuum evaporation condition, and said compound is $Li_3N$. Said Li film is fabricated by decomposing $Li_3N$ at an evaporation rate of 0.01-0.25 nm/s and an evaporation temperature of 300-450° C., and said Li film has a thickness of 0.3-5.0 nm. The present invention also relates to an organic light emitting device comprising said Li film as an electron injection layer and a method for the preparation thereof, and an organic light emitting device including an electron injection layer comprising an electron transport material doped with Li obtained by decomposing $Li_3N$ under a vacuum evaporation condition, and a method for the preparation thereof.

10 Claims, 1 Drawing Sheet

METHODS OF PREPARING A LI FILM AND METHODS OF PREPARING AN ORGANIC LIGHT EMITTING DEVICE

This application claims priority from Chinese Patent Application 200710120335.7 filed on Aug. 16, 2007. The entire contents of the aforementioned application is incorporated herein by reference.

TECHNICAL FIELD OF THE INVENTION

The present invention relates to an organic light emitting device, and more particularly, to an organic light emitting device with an improved electron injection layer.

BACKGROUND OF THE INVENTION

The study of the organic light emitting device (OLED) was begun by A. Bernanose et al. at 1950s. In 1963, an organic electroluminescence device was fabricated by Pope et al with an anthracene single crystal. However, the first high efficient organic light-emitting device (OLED) fabricated by vacuum evaporation was an OLED developed by C. W. Tang et al in 1987, wherein aniline-TPD was used as a hole transport layer (HTL), and a complex of aluminum and 8-hydroxyquinoline-$Alq_3$ was used as a light-emitting layer (EML). Its operating voltage was less than 10V, and its luminance was up to 1000 $cd/m^2$. This breakthrough development made the field becoming a currently research hotspot. After entering 1990s, organic high molecular optical-electric functional materials entered a new development stage.

For the majority carriers are holes in organic EL device, it is necessary to improve the electron injection and keep the balance of electrons and holes in organic EL devices. In order to improve the electron injection and keep the balance of electrons and holes in organic EL devices, metals having a low work function for electron injection are required. These metals such as Ca, Mg or Mg:Ag alloy et al are, however, susceptible to atmospheric moisture and oxygen, which is a main reason for the device degradation[i]. Hung[ii] et all, introduced an efficient bilayer cathode which consists of an ultra-thin LiF layer and an aluminum outlayer. However, the LiF have a relative high evaporation temperature, a thin optimal thickness (<1.0 nm) and also the improved electron injection ability requires the combinational reaction with the $Alq_3$ and the rear cathode metal (Al).

SUMMARY OF THE INVENTION

An object of the present invention is to provide a method of preparing an electron injection layer, with simple operation and a low film-forming temperature, an electron injection layer material having excellent ability, lower poisonousness, long lifetime and loose requirement of the thickness, as well as an organic light emitting device.

In order to achieve the above object, the inventor has done deep and systemic research on alkali metal compound used as an electron injection layer. After doing a lot of experiments, the inventor selects a lithium nitride as an excellent electron injection layer.

There is provided a method of preparing a Li film, wherein the Li film is fabricated by dividing a compound of Li such as $Li_3N$ under a vacuum evaporation condition.

In the method of preparing a Li film, the Li film (0.3-5.0 nm) is fabricated by the evaporation rate of 0.01-0.25 nm/s at a temperature of 300-450° C.

The optimal evaporation temperature is 380-420° C.

There is provided a method of preparing an organic light-emitting device, wherein an electronic injection layer of the device includes a Li film and the Li film is fabricated by dividing a compound of Li such as $Li_3N$ under a vacuum evaporation condition.

In the method of preparing the organic light emitting device, the Li film is fabricated by the evaporation rate of 0.01-0.25 nm/s at an evaporation temperature of 300-450° C., and the thickness of the Li film is 0.3-5.0 nm.

In the method of preparing the organic light emitting device, the optimal evaporation temperature is 380-420° C.

In the method of preparing the organic light emitting device, the electronic injection layer including Li also contains a portion of $Li_3N$, which is obtained by re-reacting Li obtained by dividing $Li_3N$ with $N_2$.

There is provided an organic light emitting device, which sequentially comprises a substrate, a diode, a light emitting layer, an electron injection layer and a cathode, wherein the electron injection layer is a doped metal Li of the electron transmission material, and Li is fabricated by dividing $Li_3N$ under a vacuum evaporation condition.

In the organic light emitting device, the electron transmission material is BCP, $Alq_3$ or BAlq.

In the organic light emitting device, the electron transmission material is $Alq_3$, the molar ratio of which with Li is 1:1, and the Li film doped with $Alq_3$ has a thickness of 30 nm.

In the organic light emitting device, the electron injection layer doped with Li further contains a portion of $Li_3N$, which is obtained by re-reacting Li obtained by dividing $Li_3N$ with $N_2$.

In the organic light emitting device, a hole injection layer and/or a hole transport layer are provided between the anode and the light emitting layer, and an electron transport layer is provided between the light emitting layer and the electron injection layer.

In the organic light emitting device, the cathode may be a metal Ag.

There is provided a method of preparing the light emitting device, wherein the electronic injection layer is prepared by evaporating the electron transport material and $Li_3N$ with double-source co-evaporation, and controlling the film-forming rate of the two so as to achieve different doping ratio.

DETAIL DESCRIPTION OF THE INVENTION

At first we studied the evaporation behavior of $Li_3N$ by a Quartz crystal microbalance method.

The quartz crystal microbalance (QCM) is a simple and extremely sensitive method. By using QCM, Ganzorig et al. demonstrated the thermal decomposition of Na salts of acetate and benzoate during vacuum vapor deposition. In this work, we report the use of an improved QCM method to investigate the possible evaporation behavior of the alkali nitrides. In order to reduce the possible experimental errors, we compare the slope of the linear relationship (frequency shift vs. mass loss) of $Li_3N$ with the slopes of those of thermally stable materials such as LiF and CsF.

Δf can be converted to the mass load on the surface of the quartz crystal wafer using the standard Sauerbrey formula as follows:

$$\Delta f = -2.26 \times 10^{-6} f^2 \Delta m/A, \tag{1}$$

where Δf (Hz) denotes a change in the oscillation frequency of a crystal oscillator; f (Hz) denotes the oscillation frequency of the quartz crystal; Δm (g) denotes a change in the mass of the materials deposited on the crystal oscillator; and A (cm$^2$) denotes the effective area of the crystal oscillator.

During the evaporation, if the source material is evaporated and partially deposited on the crystal oscillator, the surface mass increment (Δm) of the crystal oscillator is in proportion to the mass decrement in a crucible (ΔM):

$$\Delta m = k\Delta M \ (k \geq 0). \tag{2}$$

Then, according to Equation (1), we get Equation (3):

$$\Delta f = K\Delta M \ K = 2.26 \times 10^{-6} f^2 k/A. \tag{3}$$

Here, K is a positive constant and is independent of the materials used. It can be seen that Δf is in proportion to ΔM. On the other hand, if the source material is decomposed, and only a fraction (d %) is deposited, Δm would be in direct ratio to d %×ΔM:

$$\Delta m = -kd\% M \ (k \geq 0).$$

According to Equation (1), we then get Equation (4):

$$\Delta f = d\% K\Delta M \ K = 2.26 \times 10^{-6} f^2 k/A. \tag{4}$$

It is clear that the slope of the line (Δf~ΔM) may decrease to d % of its initial value if the source material is decomposed.

We introduced approximately 10 mg, 20 mg, 30 mg, and 40 mg of LiF (Aldrich, random crystals), CsF (Aldrich, >99.99%), Li$_3$N (Aldrich, >99.9%), respectively, into the BN crucible in the vacuum chamber. The resistive heating was controlled by adjusting the source current (I) of the power supply (0-170 A). The QCM device used was a conventional thickness monitor operating at a resolution and frequency stability of ±1 Hz. The QCM device was placed at approximately 300 mm above the crucible and was water-cooled to reduce the surface temperature.

Figure 1:
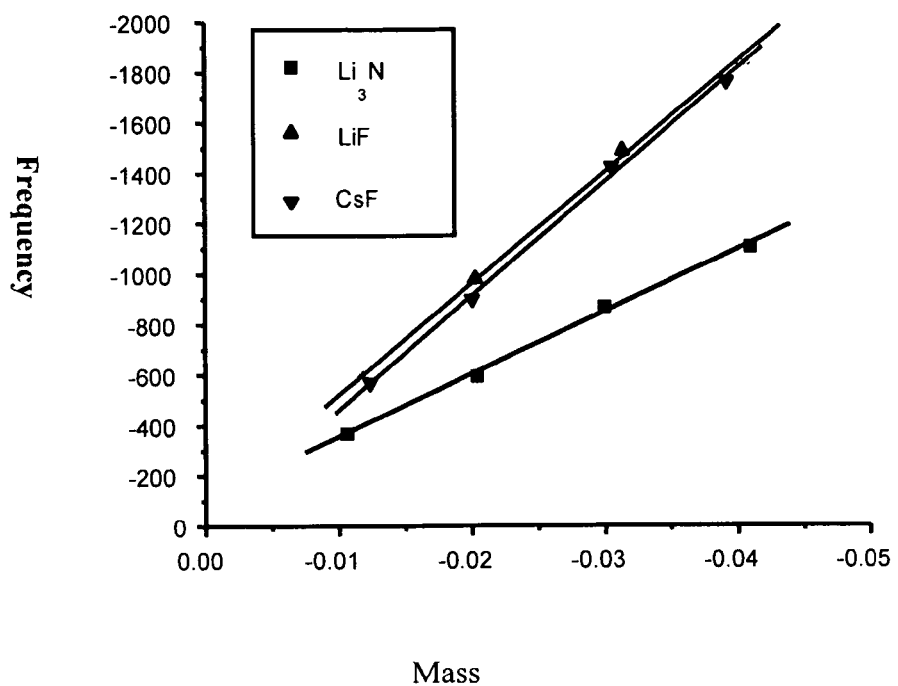
FIG. 1 is a curve of the relationship between Δf and Δm.

The Δf vs. ΔM characteristics are shown in FIG. 1. There is little mass change of the crucible after completion of evaporation. The experimental data of each material shown in FIG. 1 can be fitted to a straight line (Δf=KΔM+B).

The values of K, B, and the linear correlation coefficient (r) are summarized in Table 1. It is found that the K values of LiF and CsF are almost identical, indicating that the behaviors of LiF and CsF fit Equation (3) because they are not decomposed during the evaporation. In the cases of Li$_3$N we can see that the negative Δf values are less than those of LiF and CsF, indicating they are decomposed during heating.

Table 1. Parameters of the linear fitting (Δf=KΔM+B) from the data shown in FIG. 1. Here, r is the linear correlation coefficient.

| Materials | K (×10$^4$ Hz/g) | B (Hz) | r |
|---|---|---|---|
| LiF | 4.40 ± 0.10 | −82 ± 29 | 0.99947 |
| CsF | 4.51 ± 0.15 | −11 ± 41 | 0.99891 |
| Li$_3$N | 2.47 ± 0.09 | −105 ± 25 | 0.99868 |

Presumed that Li$_3$N is decomposed according to the following reaction:

$$2Li_3N \rightarrow 6Li + N_2 \uparrow,$$

then d % (the ratio of the molecular weight of Li to the one third of the molecular weight of Li$_3$N) can be theoretical calculated to be 59.8%. According to the Equations (3) and (5), d % can also be experimentally obtained by calculating the ratio of the slope of Li$_3$N to the slope of LiF, and the results are summarized in Table 1. It is clear that the experimental result well agrees with the theoretical one, which indicates that a layer of metallic lithium is deposited on the substrate during the thermal evaporation of Li$_3$N in vacuum.

The present invention is detailedly described through the following examples.

Figure 2:
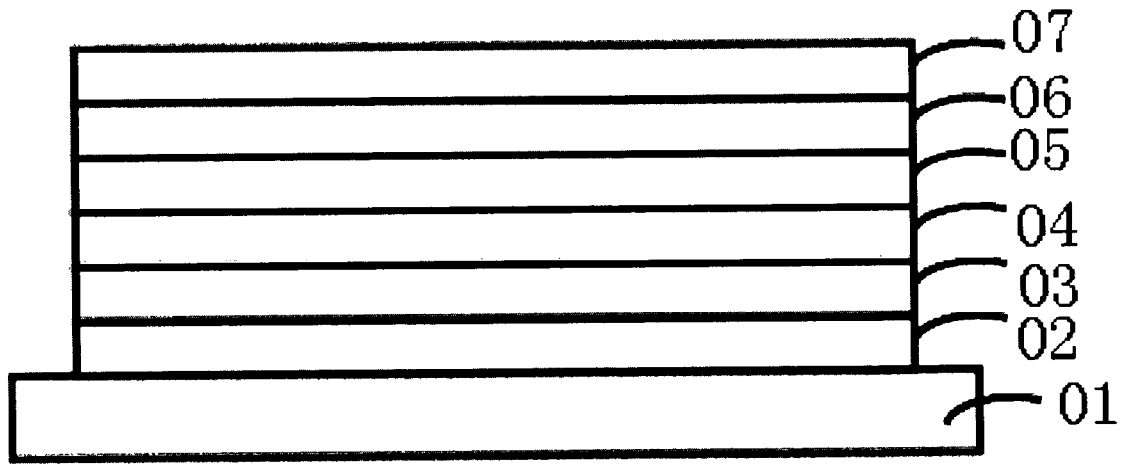
FIG. 2 is a structural diagram of the organic light emitting device.

FIG. 2 is a structural diagram of the organic light emitting device according to this invention, wherein an anode 02, a hole transport layer 03, a light emitting layer 04, an electron transport 05, an electron injection layer 06 and a cathode 07 are sequentially provided on a substrate 01.

Example 1

The device has a structure of:

ITO/NPB(50 nm)/Alq$_3$(50 nm)/Li(raw material Li$_3$N)
(Xnm)/Al(150 nm) (5), and it is prepared by:

(1) cleaning the ITO glass substrate having etched patterns with a detergent ultrasonic or deionized water ultrasonic process at a relatively high temperature, and drying the glass substrate under an infra-red lamp;

(2) placing the treated glass substrate in a vacuum chamber having a pressure of 1×10$^{-5}$ Pa, and evaporating the hole transport layer (NPB) on the anode layer, with a film-forming rate of 0.1 nm/s and a thickness of 50 nm;

(3) evaporating Alq$_3$ on the hole injection layer to form the light emitting layer and the electron transport layer, with an evaporation rate of 0.1 nm/s and a total thickness of 50 nm;

(4) evaporating Li$_3$N on the electron transport layer to form the electron injection layer containing Li decomposed from Li$_3$N as the device, with an evaporation rate of 0.01 nm/s, an evaporating temperature of 330° C., and a thickness of Xnm; and (5) evaporating an Al layer on the electron injection layer to form a cathode layer, with an evaporation rate of 1.0 nm/s and a thickness of 150 nm.

The devices are numbered from 1 to 5.

Comparative Example 1

The device has a structure of:

ITO/NPB(50 nm)/Alq$_3$(50 nm)/LiF(0.7 nm)/Al(150
nm) (6)

The method of preparing the organic light emitting device having the above structure (6) is similar to that as mentioned in Example 1. The difference therebetween lies in that the electron injection layer comprises LiF, with an evaporation rate of 0.05 nm/s and a thickness of 0.7 nm.

The structures and performances of the OLEDs according to Example 1 and Comparative Example 1 are shown in Table 2.

TABLE 2

| No. | Material | Thickness (nm) | Rate nm/s | Current efficiency (cd/A, @ 200 nit) |
|---|---|---|---|---|
| Device 1 | Li(raw material Li$_3$N) | 0.3 | 0.01 | 3.3 |
| Device 2 | Li(raw material Li$_3$N) | 0.5 | 0.01 | 3.7 |
| Device 3 | Li(raw material Li$_3$N) | 1.0 | 0.01 | 3.65 |
| Device 4 | Li(raw material Li$_3$N) | 3.0 | 0.01 | 3.5 |
| Device 5 | Li(raw material Li$_3$N) | 5.0 | 0.01 | 3.2 |
| Comparative Example 1 | LiF | 0.7 | 0.01 | 3.1 |

As can be seen from Table 2, when the device comprises a Li layer having a thickness of 0.3-0.5 nm, its current efficiency is greater than that of the device comprising an electron injection layer of LiF with an optimal thickness of 0.7 nm.

Example 2

The device has a structure of:

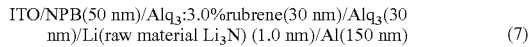
ITO/NPB(50 nm)/Alq$_3$:3.0%rubrene(30 nm)/Alq$_3$(30 nm)/Li(raw material Li$_3$N) (1.0 nm)/Al(150 nm)  (7)

Example 2 shows a device having the structure where a pigment is doped within the light emitting layer, and the method of preparing the device comprises steps (1), (2) and (5) as mentioned in Example 1. The difference therebetween lies in step (3): evaporating the light emitting layer with a double-source co-evaporating process, wherein rubrene has a doping concentration of 3 wt % in Alq$_3$, the light emitting layer has a thickness of 30 nm, Alq$_3$ which subsequently serves as the electron transport layer has a film-forming rate of 0.2 nm/s and a thickness of 30 nm. Moreover, in step (4), the evaporation rate of Li$_3$N is Xnm/s, the evaporation temperature is Y° C., and the thickness of the film is 10 nm.

We compared the performances of the devices at different Li evaporation temperature and evaporation rate, where the evaporation temperature is respectively 290, 300, 380, 420, 450, 470° C., the corresponding evaporation rate is 0.005, 0.01, 0.016, 0.08, 0.20 and 0.25 nm/s, the resultant electron injection layer has a thickness of 1.0 nm, and the devices are numbered from 6-11. The performance parameters of the devices are shown in Table 3.

TABLE 3

| No | Evaporation rate of Li X nm/s | Evaporation temperature Y ° C. | Current efficiency (cd/A, @ 200 nit) | Life time (h) |
| --- | --- | --- | --- | --- |
| Device 6 | 0.005 nm/s | 290° C. | 4.7 | 3500 |
| Device 7 | 0.01 nm/s | 300° C. | 5.4 | 4200 |
| Device 8 | 0.016 nm/s | 380° C. | 5.9 | 4600 |
| Device 9 | 0.08 nm/s | 420° C. | 5.6 | 4400 |
| Device 10 | 0.20 nm/s | 450° C. | 5.1 | 4000 |
| Device 11 | 0.25 nm/s | 470° C. | 4.8 | 3100 |

As can be seen from Table 3, for a pigment-doped organic light emitting device containing Li having a thickness of 1.0 nm as the electron injection layer, the evaporation temperature and rate have significant influence on the life time of the devices. The device has life time and current efficiency when the evaporation temperature is 300-450° C. and the evaporation rate is 0.01-0.20 nm/s obviously higher than the life time and current efficiency when the evaporation temperature is below 300° C. or above 450° C. When the temperature is 470° C., the current efficiency and life time are obviously decreased. This is because the amount of N2 in the chamber is increased due to the decomposition of Li$_3$N at a high evaporation temperature. The preferable evaporation temperature is between 380-420° C.

Example 3

An N-type device is fabricated by doping Li obtained by evaporating Li$_3$N into the electron transport material Alq$_3$.

The device has a structure of:

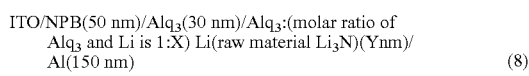
ITO/NPB(50 nm)/Alq$_3$(30 nm)/Alq$_3$:(molar ratio of Alq$_3$ and Li is 1:X) Li(raw material Li$_3$N)(Ynm)/Al(150 nm)  (8)

The method of preparing the device (8) also comprises steps (1), (2), (3) and (5) as mentioned in Example 1. The difference lies in step (4), wherein during the preparation of the electron injection layer, Alq$_3$ is doped with Li by using a double-source co-evaporation process, with a molar ratio of Alq$_3$ to Li of 1:X, and a film having a thickness of Ynm. The devices are numbered from 12-17.

Comparative Example 2

The device has a structure of

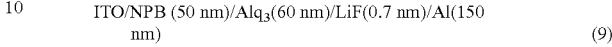
ITO/NPB (50 nm)/Alq$_3$(60 nm)/LiF(0.7 nm)/Al(150 nm)  (9)

The method of preparing the device comprises steps (1), (2), (3) and (5) as mentioned in Example 1. The difference lies in step (4), where LiF is evaporated as the electron injection layer, with an evaporation rate of 0.05 nm/s and a thickness of 0.7 nm.

The performance of the OLEDs according to Example 3 and Comparative Example 2 is shown in Table 3:

TABLE 3

| No | Structure of the Electron injection layer | Molar ratio | Y (nm) | Current efficiency (cd/A, @ 200 nit) | Life-time (h) |
| --- | --- | --- | --- | --- | --- |
| Device 12 | Alq$_3$:Li (raw material Li$_3$N)(30 nm) | 1:1 | 30 | 3.9 | 3600 |
| Device 13 | Alq$_3$:Li (raw material Li$_3$N)(30 nm) | 1:2 | 30 | 3.8 | 3000 |
| Device 14 | Alq$_3$:Li (raw material Li$_3$N)(30 nm) | 1:5 | 30 | 3.0 | 2100 |
| Device 15 | Alq$_3$:Li (raw material Li$_3$N)(50 nm) | 1:1 | 50 | 3.5 | 3700 |
| Device 16 | Alq$_3$:Li (raw material Li$_3$N)(50 nm) | 1:2 | 50 | 3.3 | 3100 |
| Device 17 | Alq$_3$:Li (raw material Li$_3$N)(50 nm) | 1:5 | 50 | 2.9 | 2000 |
| Comparative Example 2 | LiF(0.7 nm) | | 0.7 | 3.1 | 2600 |

As can be seen from Table 3, the device having a molar ratio of Alq$_3$ to Li of 1:1 and a film of Li doped with Alq$_3$ having a thickness of 30 nm have the optimal current efficiency and life time.

Example 4

The device has a structure of:

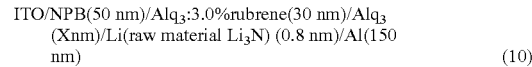
ITO/NPB(50 nm)/Alq$_3$:3.0%rubrene(30 nm)/Alq$_3$ (Xnm)/Li(raw material Li$_3$N) (0.8 nm)/Al(150 nm)  (10)

Example 4 shows the structure of the device having a light emitting layer doped with a pigment, and the method of preparing the device comprises steps (1), (2) and (5) as mentioned in Example 1. The difference lies in step (3): evaporating the light emitting layer with a double-source co-evaporating process, wherein rubrene has a doping concentration of 3% in Alq$_3$, the light emitting layer has a thickness of 30 nm, Alq$_3$ which subsequently serves as the electron transport layer has a film-forming rate of 0.2 nm/s and a thickness of 10, 20, 30 and 40 nm.

In addition, in step (4) of evaporating Li$_3$N, the evaporation temperature is 350° C., the evaporation rate is 0.01 nm/s, and the film has a thickness of 0.8 nm. The devices are numbered from 18 to 22.

The performance of the OLEDs according to Example 4 is shown in Table 4.

TABLE 4

| No | Alq$_3$ thickness Xnm | Temp (° C.) | Rate (nm/s) | Current efficiency (cd/A, @ 200 nit) | Life-time (h) |
|---|---|---|---|---|---|
| Device 18 | 10 | 350° C. | 0.01 nm/s | 6 | 5500 |
| Device 19 | 20 | 350° C. | 0.01 nm/s | 5.8 | 6200 |
| Device 20 | 30 | 350° C. | 0.01 nm/s | 5.7 | 8600 |
| Device 21 | 40 | 350° C. | 0.01 nm/s | 5.5 | 9000 |
| Device 22 | 30 | 600° C. | 0.05 nm/s | 4.8 | 3100 |

As can be seen from Table 4, when the pigment-doped organic light emitting device comprises Li having a thickness of 0.8 nm as the electron injection layer, the difference in the thickness of the electron transport layer will significantly influence the life time of the device, and when the electron transport layer has a thickness of 30 nm, the device has a relatively long life time and a relatively high current efficiency. This is mainly because Li is easily diffused to the light emitting layer due to a thin electron transport layer.

Example 5

According to the electron injection layer of the present invention, since Li$_3$N is evaporated to obtain Li, the subsequent metals have no special limitation, e.g. the cathode may not be limited as Al which is commonly used.
The following devices are designed:

Device 23: ITO/NPB (50 nm)/Alq$_3$ (50 nm)/Li (raw material Li$_3$N) (1.0 nm)/Ag (10 nm)     (11)

Device 24: ITO/NPB (50 nm)/Alq$_3$ (50 nm)/Li (raw material Li$_3$N) (1.0 nm)/Ag (150 nm)     (12)

Device 25: ITO/NPB (50 nm)/Alq$_3$ (50 nm)/Li (raw material Li$_3$N) (1.0 nm)/Al (150 nm)     (13)

It is shown by the experiments that devices 23-25 respectively have a current density of 3.2, 3.8 and 3.5 cd/A, thus the device comprising Ag as the electrode has a high current efficiency. Moreover, because device 23 has a thin Ag electrode, the light can transmit through both the ITO anode and the Ag layer of the cathode, thereby to achieve a function of top-emitting or double-emitting.

The invention claimed is:

1. A method of preparing a Li film, comprising:
   directly decomposing a compound of Li under a vacuum evaporation condition; and
   forming a Li film consisting essentially of metal Li and optional Li$_3$N.

2. The method of preparing a Li film according to claim 1, wherein said compound is Li$_3$N.

3. The method of preparing a Li film according to claim 2, wherein said Li film is fabricated by decomposing Li$_3$N at an evaporation rate of 0.01-0.25 nm/s and an evaporation temperature of 300-450° C., and said Li film has a thickness of 0.3-5.0 nm.

4. The method of preparing a Li film according to claim 3, wherein the evaporation temperature is 380-420° C.

5. A method of preparing an organic light emitting device comprising an electron injection layer containing a Li film, comprising:
   directly decomposing a compound of Li under a vacuum evaporation condition;
   forming a Li film consisting essentially of metal Li and optional Li$_3$N; and
   incorporating said Li film into an electron injection layer of an organic light emitting device.

6. The method of preparing an organic light emitting device according to claim 5, wherein said compound is Li$_3$N.

7. The method of preparing an organic light emitting device according to claim 6, wherein said Li film is fabricated by decomposing Li$_3$N at an evaporation rate of 0.01-0.25 nm/s and an evaporation temperature of 300-450° C., and said Li film has a thickness of 0.3-5.0 nm.

8. The method of preparing an organic light emitting device according to claim 7, wherein the evaporation temperature is 380-420° C.

9. The method of preparing an organic light emitting device according to claim 6, wherein the electron injection layer comprises a portion of Li$_3$N.

10. The method of preparing an organic light emitting device according to claim 9, wherein said portion of Li$_3$N is fabricated by re-reacting Li obtained by decomposing Li$_3$N with N$_2$.

* * * * *